United States Patent
Ito

(10) Patent No.: US 9,691,968 B2
(45) Date of Patent: Jun. 27, 2017

(54) MAGNETIC MEMORY AND METHOD FOR MANUFACTURING THE SAME

(71) Applicant: Yuichi Ito, Seongnam-si (KR)

(72) Inventor: Yuichi Ito, Seongnam-si (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 65 days.

(21) Appl. No.: 14/630,398

(22) Filed: Feb. 24, 2015

(65) Prior Publication Data

US 2016/0072048 A1 Mar. 10, 2016

Related U.S. Application Data

(60) Provisional application No. 62/047,592, filed on Sep. 8, 2014.

(51) Int. Cl.
| | |
|---|---|
| *H01L 43/02* | (2006.01) |
| *H01L 43/08* | (2006.01) |
| *H01L 43/12* | (2006.01) |
| *H01L 27/22* | (2006.01) |

(52) U.S. Cl.
CPC ............. *H01L 43/08* (2013.01); *H01L 43/02* (2013.01); *H01L 43/12* (2013.01); *H01L 27/228* (2013.01)

(58) Field of Classification Search
CPC ....... H01L 27/226; H01L 43/02; H01L 43/08; H01L 43/12
See application file for complete search history.

(56) References Cited

U.S. PATENT DOCUMENTS

| | | | | |
|---|---|---|---|---|
| 2008/0135958 A1* | 6/2008 | Kajiyama | ............... | B82Y 10/00 257/421 |
| 2008/0149907 A1* | 6/2008 | Hsu | ....................... | G11C 13/0011 257/2 |
| 2009/0016094 A1* | 1/2009 | Rinerson | ............. | G11C 11/5685 365/148 |
| 2012/0217476 A1* | 8/2012 | Ikeno | ..................... | G11C 11/161 257/16 |
| 2012/0326251 A1 | 12/2012 | Yamakawa et al. | | |
| 2013/0001715 A1* | 1/2013 | Yamakawa | ............. | H01L 43/12 257/421 |
| 2013/0119494 A1* | 5/2013 | Li | ........................... | H01L 43/08 257/421 |
| 2014/0042567 A1* | 2/2014 | Jung | ........................ | H01L 43/08 257/421 |

FOREIGN PATENT DOCUMENTS

| | | |
|---|---|---|
| JP | 06163681 A | 6/1994 |
| JP | 3576118 B2 | 10/2004 |

OTHER PUBLICATIONS

Jong-Cheol Park, KR10120140002405, Jan. 2014, Republic of Korea.*

* cited by examiner

*Primary Examiner* — John C Ingham
*Assistant Examiner* — Ismail Muse
(74) *Attorney, Agent, or Firm* — Holtz, Holtz & Volek PC

(57) ABSTRACT

According to one embodiment, a magnetic memory is disclosed. The magnetic memory includes a substrate, an electrode provided on the substrate, a first insulating film surrounding a side surface of the electrode. The first insulating film contains oxygen. The magnetic memory further includes a second insulating film provided between the electrode and the first insulating film, and surrounding the side surface of the electrode. The second insulating film (Continued)

contains nitrogen. A magnetoresistance effect element is provided on the electrode.

13 Claims, 9 Drawing Sheets

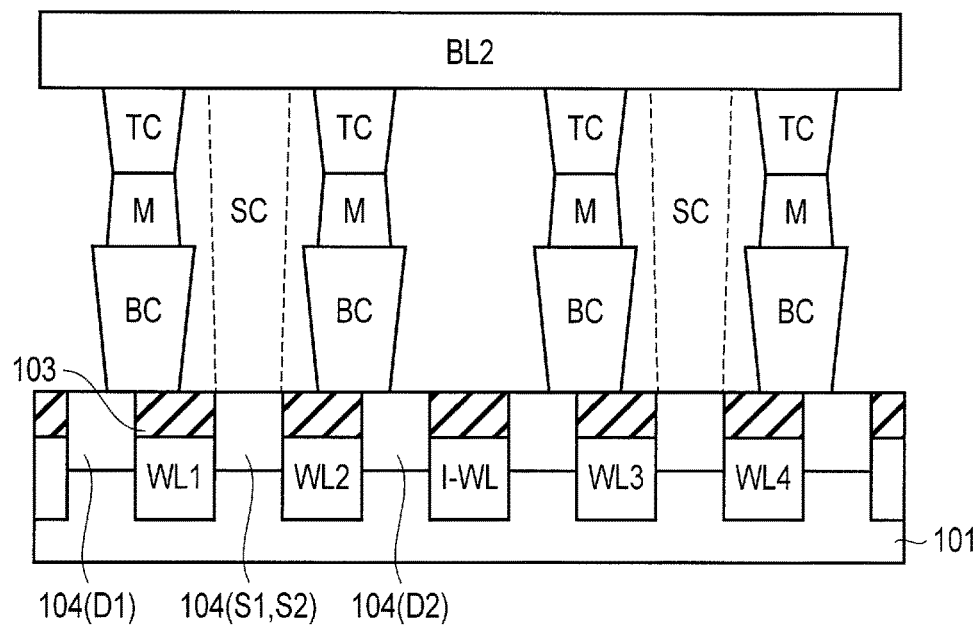
F I G. 2
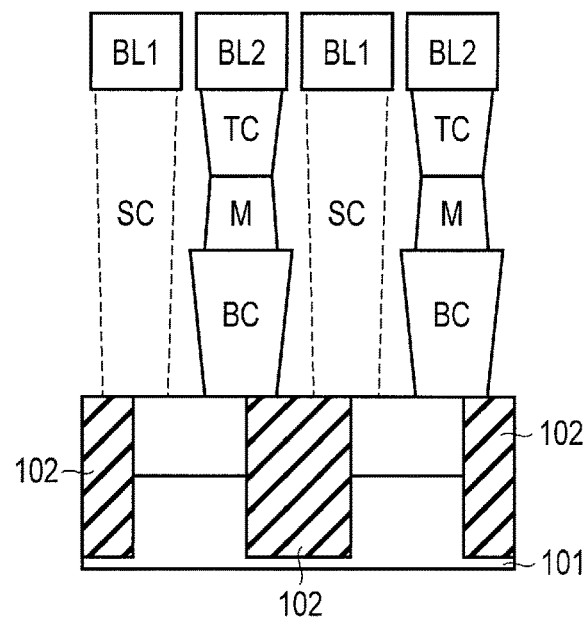
F I G. 3

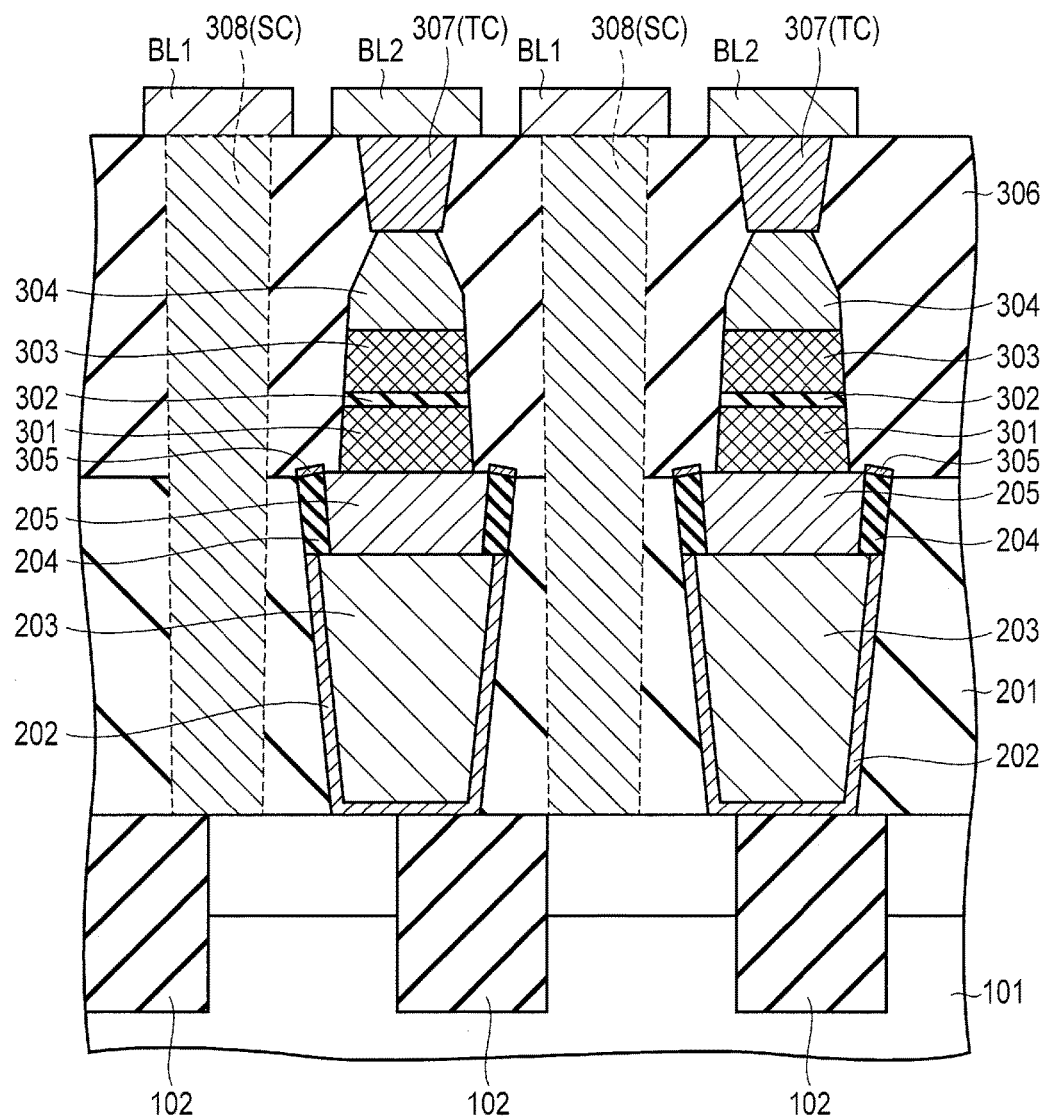
F I G. 4

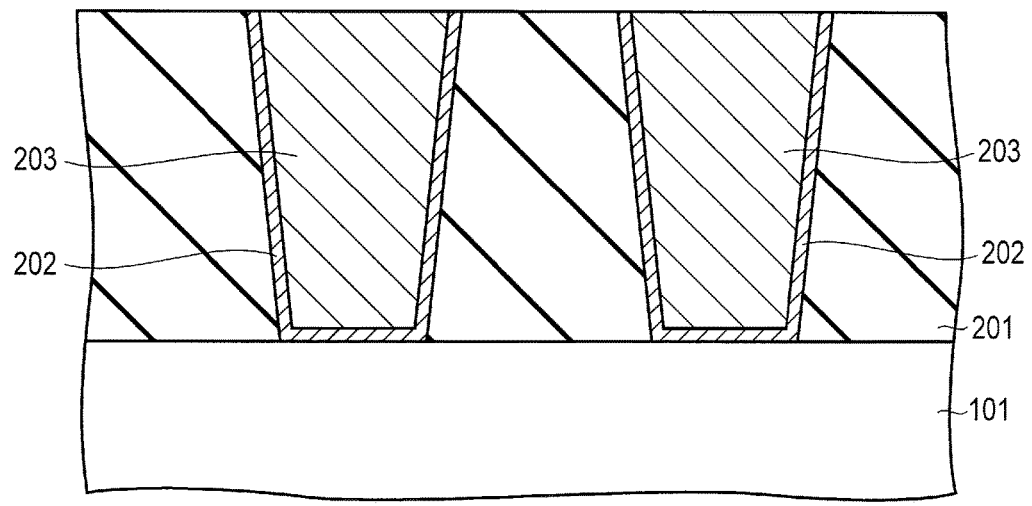
F I G. 5
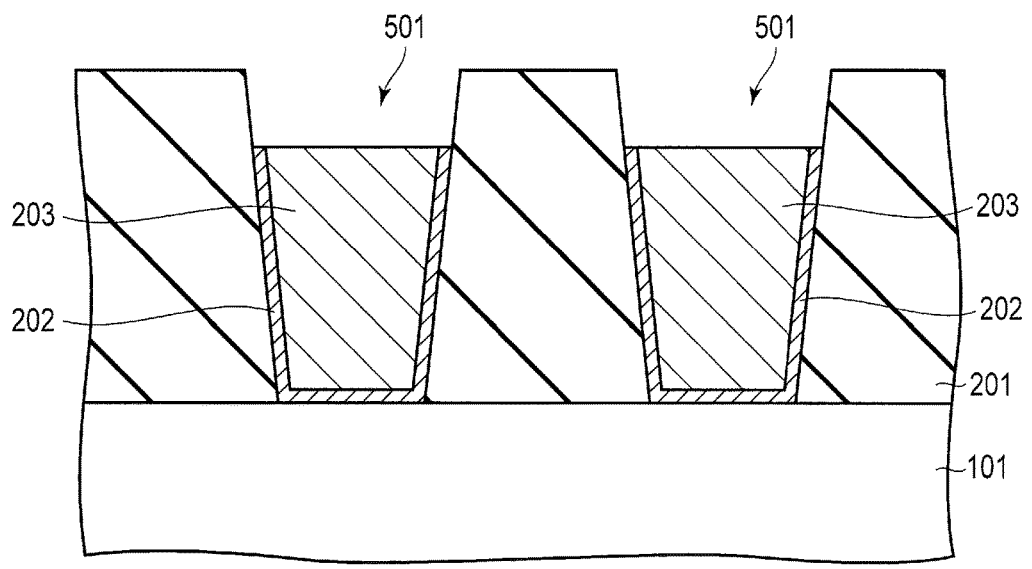
F I G. 6

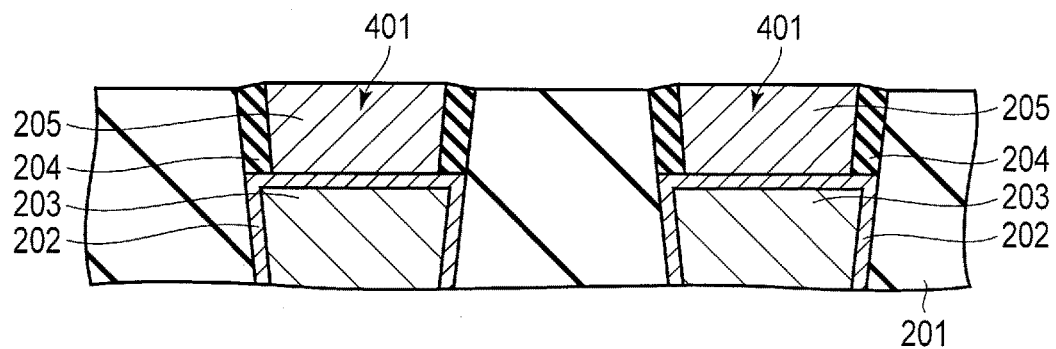
F I G. 10
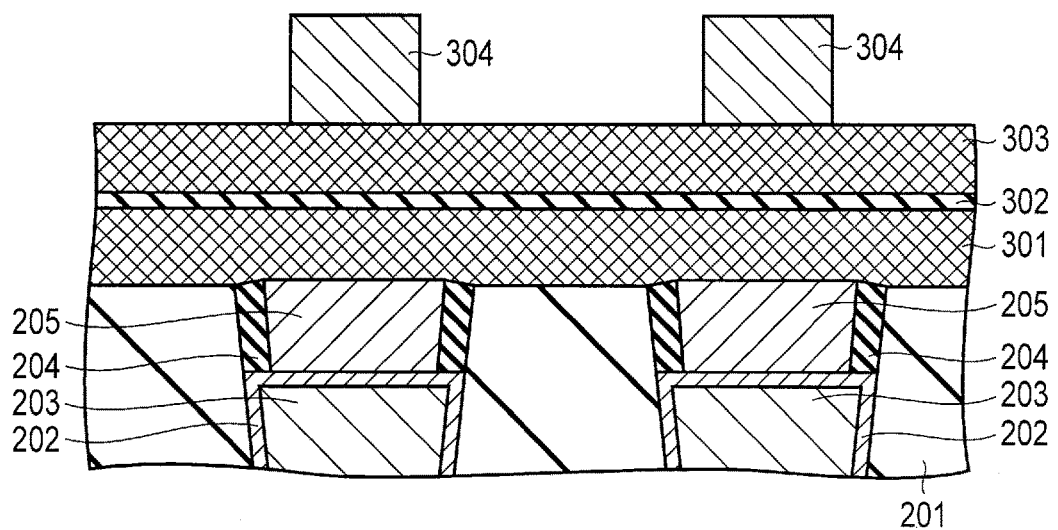
F I G. 11

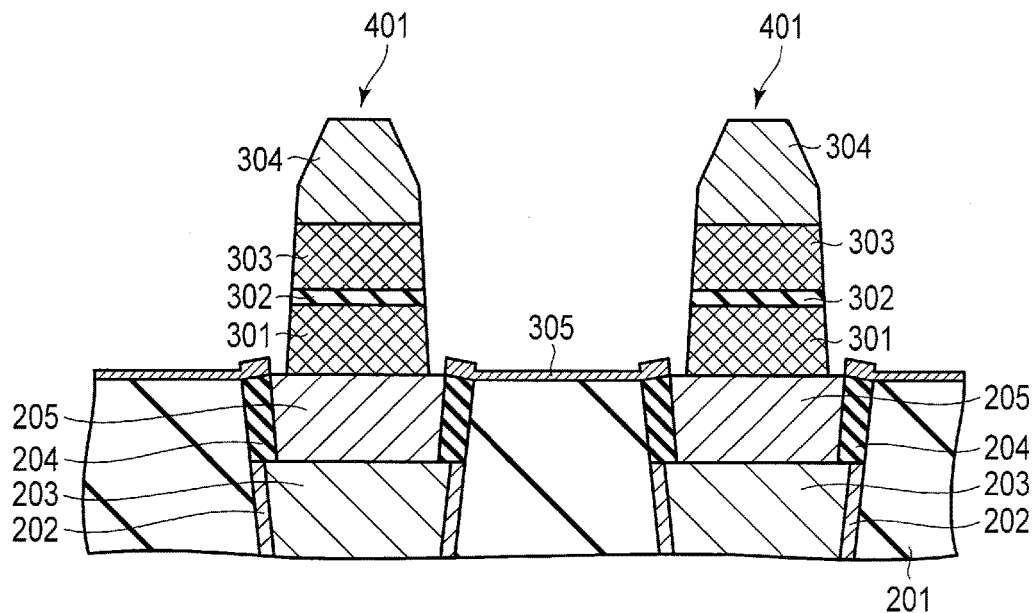
F I G. 12A
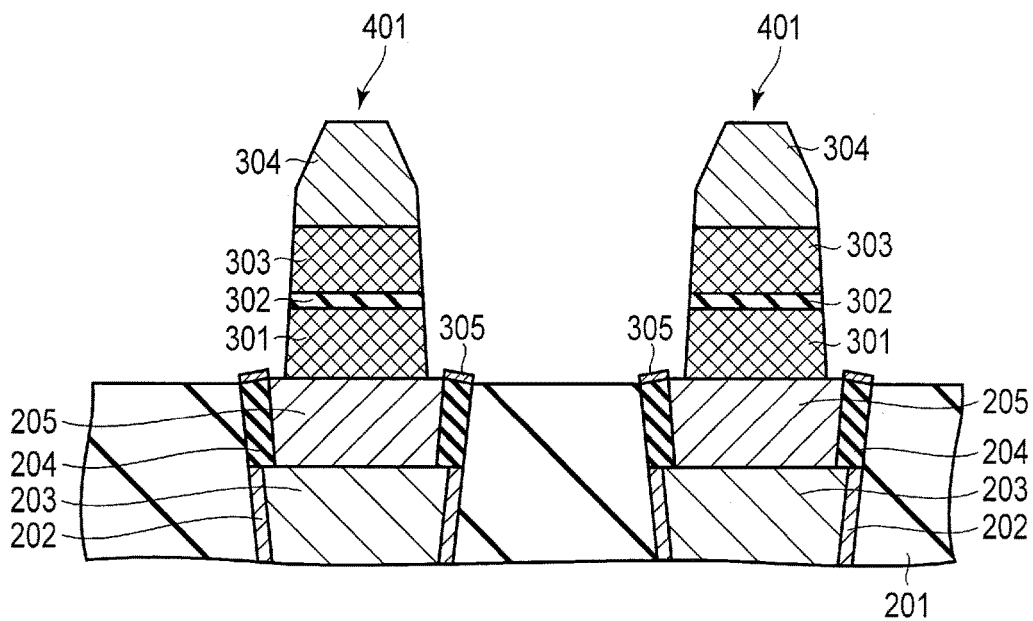
F I G. 12B

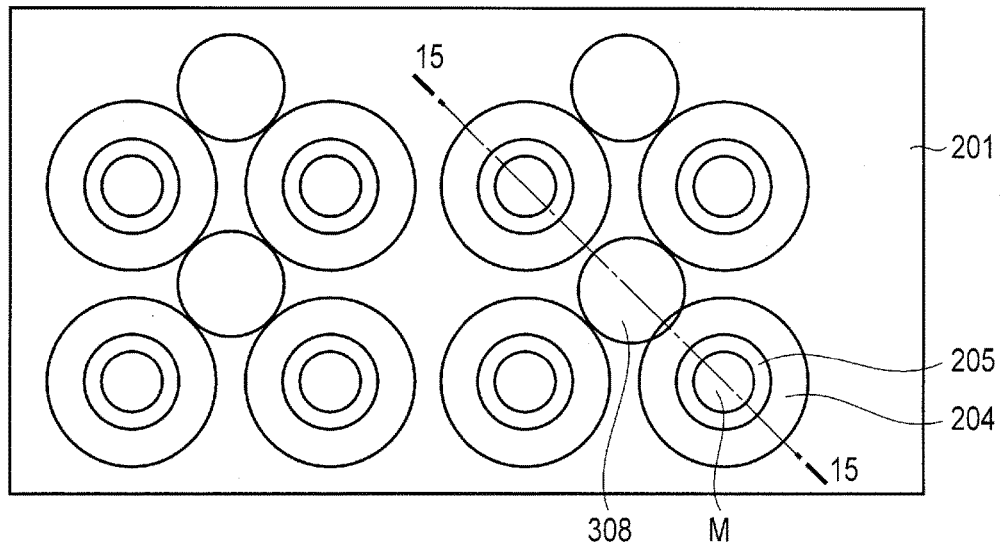
F I G. 14
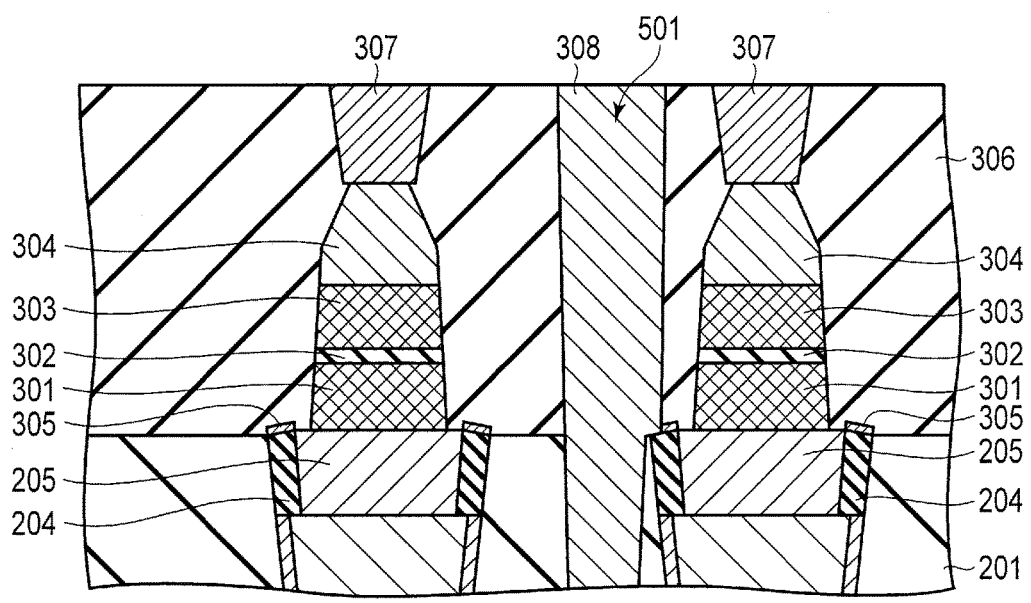
F I G. 15

MAGNETIC MEMORY AND METHOD FOR MANUFACTURING THE SAME

CROSS-REFERENCE TO RELATED APPLICATIONS

This application claims the benefit of U.S. Provisional Application No. 62/047,592, filed Sep. 8, 2014, the entire contents of which are incorporated herein by reference.

FIELD

Embodiments described herein relate generally to a magnetic memory and a method for manufacturing the same.

BACKGROUND

In recent years, a semiconductor memory using a resistance change element as a storage element, such as a PRAM (phase-change random access memory) or an MRAM (magnetoresistive random access memory) has been attracting attention and been developed. The MRAM is a device which performs a memory operation by storing binary 1 or 0 in a memory cell by using magnetoresistance, and features non-volatility, high-speed operation, high integration, and high reliability.

One of the magnetoresistive elements is a magnetic tunnel junction (MTJ) element including a laminated structure of three layers, namely, a storage layer having a variable magnetization direction, an insulating film as a tunnel barrier, and a reference layer maintaining a predetermined magnetization direction.

The resistance of the MTJ element varies with the magnetization directions of the storage layer and the reference layer, has a minimum value when the magnetization directions are parallel and has a maximum value when the magnetization directions are antiparallel, and stores information by associating the parallel state and the antiparallel state with binary 0 and 1.

There are schemes for writing information on the MTJ element: one is a magnetic field writing scheme in which only the magnetization direction of the storage layer is reversed by a current magnetic field generated when a current flows through a write line, and another is a writing scheme (of spin-injection) using spin angular momentum transfer in which the magnetization direction of the storage layer is reversed by passing a spin-polarized current through the MTJ element itself.

In the former scheme, when the element size is reduced, the coercivity of the magnetic body constituting the storage layer increases, and thus the write current tends to increase. Consequently, it is difficult to achieve both miniaturization and low current.

On the other hand, in the latter scheme (spin-injection writing scheme), the smaller the volume of the magnetic layer constituting the storage layer is, the fewer spin-polarized electrons will need to be injected. Therefore, it is expected that miniaturization and low current can both be easily achieved.

BRIEF DESCRIPTION OF THE DRAWINGS

FIG. 2 is a 2-2 cross-sectional view of FIG. 1;
FIG. 3 is a 3-3 cross-sectional view of FIG. 1;
FIG. 4 is a detailed cross-sectional view of FIG. 3;
FIG. 5 is a cross-sectional view illustrating a method for manufacturing the magnetic memory of an embodiment;
FIG. 6 is a cross-sectional view illustrating the method for manufacturing the magnetic memory, following FIG. 5;
FIG. 10 is a cross-sectional view illustrating the method for manufacturing the magnetic memory, following FIG. 9;
FIG. 11 is a cross-sectional view illustrating the method for manufacturing the magnetic memory, following FIG. 10;
FIGS. 12A and 12B are cross-sectional views illustrating the method for manufacturing the magnetic memory, following FIG. 11;
FIG. 14 is a plan view corresponding to the magnetic memory shown in FIG. 13;
and
FIG. 15 is a 15-15 cross-sectional view of FIG. 14.

DETAILED DESCRIPTION

Figure 1:
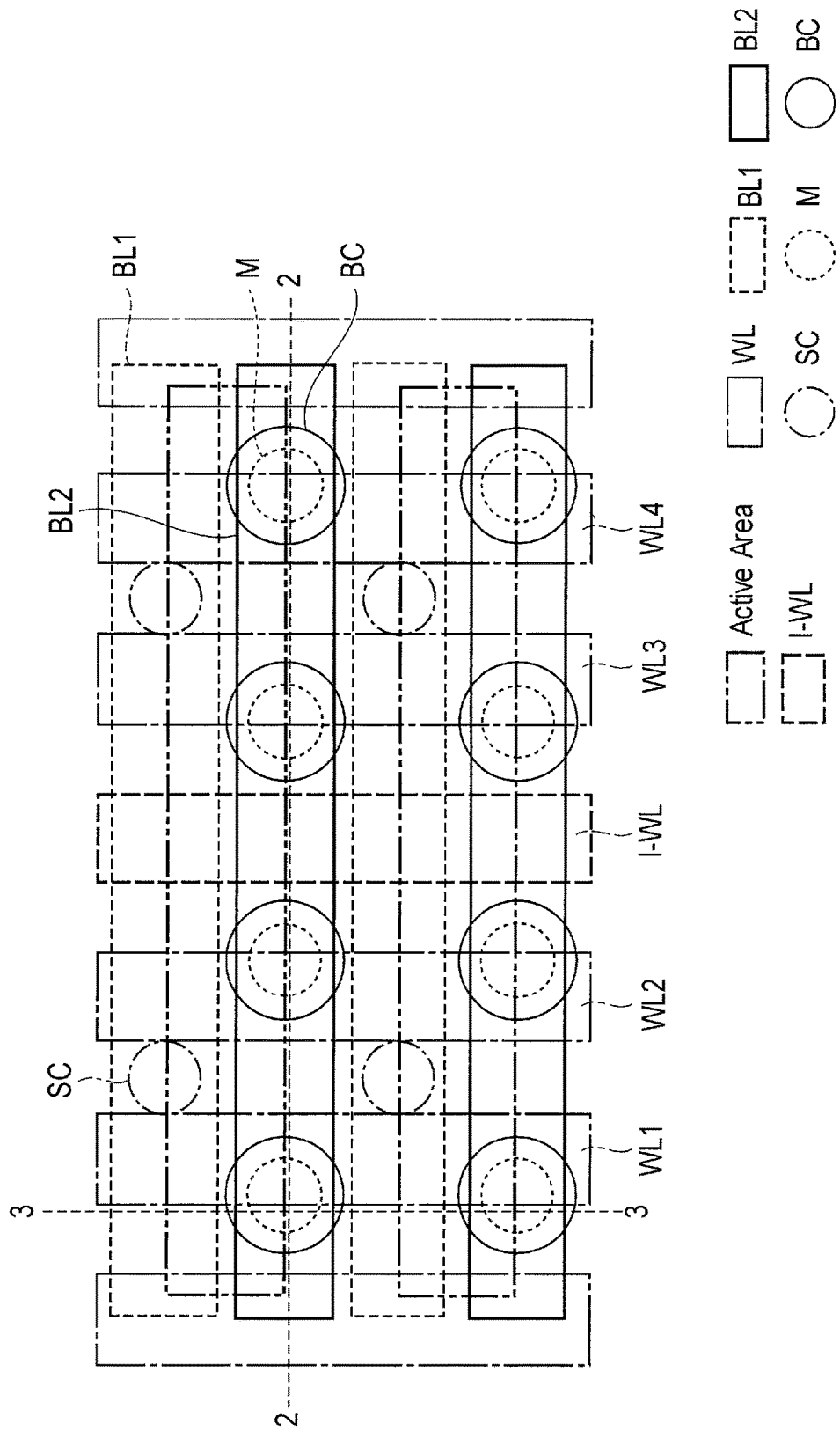
FIG. 1 is a plan view schematically illustrating a magnetic memory of an embodiment.
Figure 7:
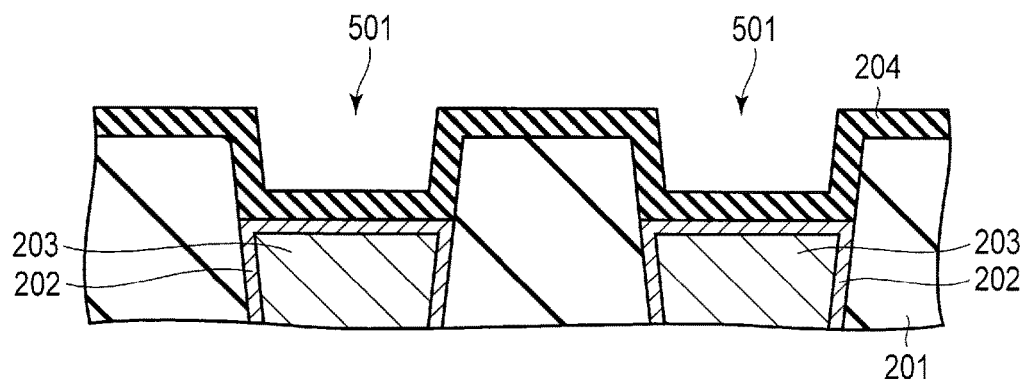
FIG. 7 is a cross-sectional view illustrating the method for manufacturing the magnetic memory, following FIG. 6.
Figure 8:
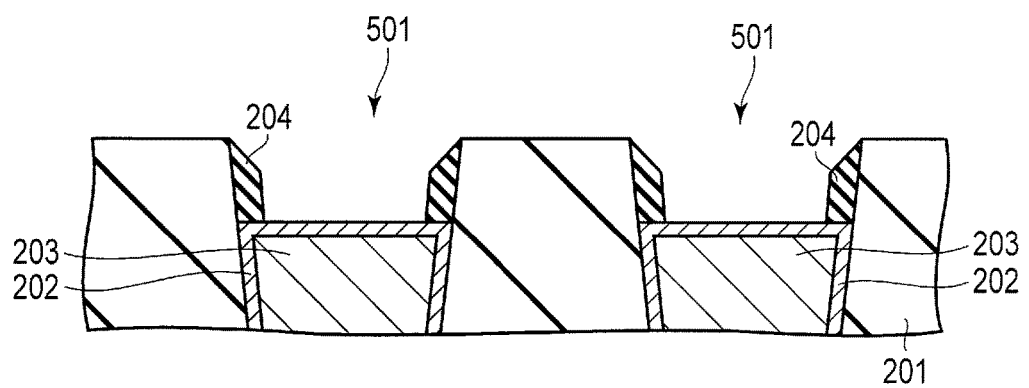
FIG. 8 is a cross-sectional view illustrating the method for manufacturing the magnetic memory, following FIG. 7.
Figure 9:
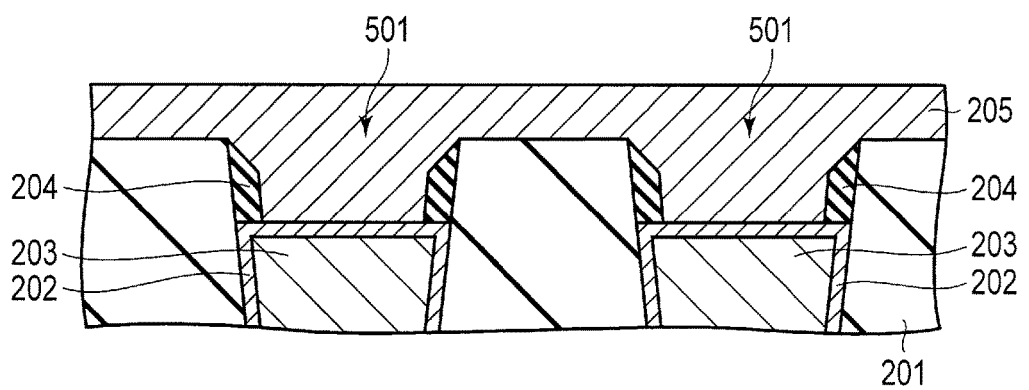
FIG. 9 is a cross-sectional view illustrating the method for manufacturing the magnetic memory, following FIG. 8.

In general, according to one embodiment, a magnetic memory is disclosed. The magnetic memory includes a substrate; an electrode provided on the substrate; a first insulating film surrounding a side surface of the electrode. The first insulating film contains oxygen. The magnetic memory further includes a second insulating film provided between the electrode and the first insulating film, and surrounding the side surface of the electrode. The second insulating film contains nitrogen. A magnetoresistance effect element is provided on the electrode.

In general, according to one embodiment, a method for manufacturing a magnetic memory is disclosed. The method includes forming a first insulating film on a substrate; forming a concave portion in the first insulating film; forming a second insulating film on a side surface of the concave portion. The first insulating film contains oxygen, and the second insulating film contains nitrogen. The method further includes forming an electrode in the concave portion; and forming a magnetoresistance effect element on the electrode.

In the following, the magnetic memory of the present embodiment will be described in accordance with its manufacturing method with reference to the drawings. In the drawings, the same portions are given the same reference numbers. Also, the overlapping explanation is made as necessary.

FIG. 1 is a plan view schematically illustrating the magnetic memory of an embodiment, FIG. 2 is a 2-2 cross-sectional view of FIG. 1, and FIG. 3 is a 3-3 cross-sectional view of FIG. 1. The member shown by a broken line in FIGS. 2 and 3 represents a plug SC on the back side, which is not visible in the 2-2 section and the 3-3 section.

The magnetic memory of the present embodiment is an MRAM comprising an MTJ element (magnetoresistance effect element) of a spin injection write mode as a storage element. For the MTJ element, a perpendicular magnetization film is used. A perpendicular magnetization film is a magnetization film whose magnetization direction (magnetization easy axis direction) is substantially perpendicular to the film surface of a perpendicular magnetization film.

In the figures, 101 denotes a silicon substrate (semiconductor substrate), an isolation region 102 is formed in a surface of the silicon substrate 101. The isolation region 102 defines active areas.

The MRAM of the present embodiment comprises a first select transistor whose gate electrode is a word line WL1, a first MTJ element M connected to one source/drain region 104 (drain region D1) of the first select transistor, a second transistor whose gate electrode is a second word line WL2, and a second MTJ element M connected to one source/drain region 104 (drain region D2) of the second select transistor. In the figures, 103 denotes a cap insulating film.

That is, one memory cell of the present embodiment comprises one MTJ (memory element) and one select transistor, and the two select transistors of the two neighboring memory cells share the other source/drain region 104 (source region S1, S2).

The gate (gate insulating film, gate electrode) of the select transistor of the present embodiment is buried in the surface of the silicon substrate 101. That is, the gate of the present embodiment has a BG (Buried Gate) structure. Similarly, the gate (word line I-WL) for the isolation also has the BG structure.

One source/drain region 104 (D1) of the first select transistor is connected to a lower part of the first MTJ element M via a plug BC. An upper part of the first MTJ element M is connected to a second bit line BL2 via a plug TC.

The other source/drain region 104 (S1) of the first select transistor is connected to a first bit line (source line) BL1 via a plug SC.

In the present embodiment, the plane patterns of plug BC, MTJ element M, plug TC and plug SC are circular, however, other shapes may be employed.

One source/drain region 104 (D2) of the second select transistor is connected to a lower part of the second MTJ element M via a plug BC. An upper part of the second MTJ element M is connected to the second bit line BL2 via a plug TC.

The other source/drain region 104 (S2) of the second select transistor is connected to the first bit line BL1 via the plug SC.

The first select transistor, first MTJ element M, second select transistor and second MTJ element M (two memory cells) are provided in each active area. Two neighboring active areas are isolated by the isolation region 102.

Word lines WL3 and WL4 correspond to the word lines WL1 and WL2, respectively. Accordingly, two memory cells are constituted by a first select transistor whose gate electrode is the word line WL3, a first MTJ element M connected to one source/drain region of the first select transistor, a second transistor whose gate electrode is a second word line WL2, and a second MTJ element M connected to one source/drain region 104 of the second select transistor.

FIG. 4 is a detailed cross-sectional view of FIG. 3. The magnetic memory of the present embodiment includes an oxygen-based insulating film 201 which surrounds the side surface of a lower electrode 205, and a nitrogen-based insulating film 204 which is provided between the lower electrode 205 and the oxygen-based insulating film 201 and surrounds the side surface of the lower electrode 205. In other words, in the present embodiment, the side surface of the lower electrode 205 is surrounded by the nitrogen-based insulating film 204, and the outside surface of the nitrogen-based insulating film 204 is surrounded by the nitrogen-based insulating film 204. A conductor 305 is formed on the upper surface of the nitrogen-based insulating film 204.

In the following, the magnetic memory of the present embodiment will be further described in accordance with its manufacturing method. FIGS. 5-13 are cross-sectional views illustrating the method for manufacturing the magnetic memory of the present embodiment. FIGS. 5-13 are cross-sectional views corresponding to the 3-3 cross-section of FIG. 1.

[FIG. 5]

By means of a known method, the above-mentioned isolation region and selected transistors (not shown) are formed in the silicon substrate 101. Subsequently, the oxygen-based insulating film 201 is formed on the silicon substrate 101. Then, by means of a known damascene process, a contact plug 203 is formed in the oxygen-based insulating film 201 via a barrier metal film 202.

The oxygen-based insulating film 201 is an insulating film which contains oxygen. The oxygen-based insulating film 201 may further contain nitrogen. However, the concentration (amount) of nitrogen in the oxygen-based insulating film 201 is lower than that of nitrogen in the nitrogen-based insulating film 204. Alternatively, the oxygen-based insulating film 201 may not contain nitrogen. The oxygen-based insulating film 201 is an insulating film which contains, for example, silicon and oxygen. One of the examples is a $SiO_2$ film. The oxygen-based insulating film 201 is formed by, for example, CVD process.

[FIG. 6]

The upper portions of the barrier metal film 202 and the contact plug 203 are removed by etchback. As a result, a concave portion 501 is created on the surface of the oxygen-based insulating film 201. The etchback is performed by using, for example, reactive ion etching (RIE).

[FIG. 7]

The nitrogen-based insulating film 204 is formed on the whole surface (silicon substrate 101, oxygen-based insulating film 201) so as to cover the bottom portion and the side wall of the concave portion 501.

The nitrogen-based insulating film 204 is an insulating film which contains nitrogen. The nitrogen-based insulating film 204 may further contain oxygen. However, the concentration (amount) of oxygen in the nitrogen-based insulating film 204 is lower than that of nitrogen in the oxygen-based insulating film 201. Alternatively, the nitrogen-based insulating film 204 may not contain oxygen. The nitrogen-based insulating film 204 is, for example, an insulating film which contains silicon and nitrogen, one example is a $Si_3N_4$ film. The nitrogen-based insulating film 204 may be an insulating film which contains silicon, carbon and nitrogen. The nitrogen-based insulating film 204 is formed by, for example, a CVD process.

[FIG. 8]

By etchback, the nitrogen-based insulating film 204 on the bottom portion of the concave portion 501 and the nitrogen-based insulating film 204 on the upper surface of the oxygen-based insulating film 201 are removed. In other words, the nitrogen-based insulating film 204 is processed so that the nitrogen-based insulating film 204 selectively remains on the side wall of the concave portion 501. The nitrogen-based insulating film 204 on the side wall on the opening side of the concave portion 501 becomes thin. The etchback is performed by using, for example, an RIE process.

[FIG. 9]

A conductive film 205 to be the lower electrode is formed on the whole surface. The conductive film 205 is formed so as to fill the concave portion 501. The material of the lower electrode 205 is, for example, tantalum (Ta), tantalum nitride (TaN), titanium (Ti), titanium nitride (TiN), copper (Cu), tungsten (W) or ruthenium (Ru).

Depending on the materials being used, a barrier metal layer is used in view of metal diffusion into an insulating interlayer film (for example, insulating films 204 and 205) or in view of the adhesiveness between the lower electrode and the insulating interlayer film. The barrier metal film is, for example, a single-layer film of a titanium (Ti) film or a TiN film, or a laminated film of a Ti film and a TiN film.

[FIG. 10]

The lower electrode 205 is formed and the surface of the lower electrode 205 is planarized by removing the conductive film 205 outside the concave portion 501 using chemical mechanical polishing (CMP) process.

[FIG. 11]

By using a sputtering process, each layer constituting an MTJ element which includes a first magnetic layer 301 as a storage layer, a tunnel barrier layer 302 and a second magnetic layer 303 as a reference layer is sequentially formed on the whole surface (oxygen-based insulating film 201, nitrogen-based insulating film 204, lower electrode 205).

Since the upper surface of the lower electrode 205 is flat, high-quality layers 301-303 are formed on the upper surface of the lower electrode 205. For example, a high-quality MgO layer as the tunnel barrier 302 is formed.

A layer constituting the MTJ element other than the first magnetic layer 301, the tunnel barrier layer 302 and the second magnetic layer 303 is, for example, a shift cancelling layer (not shown). A shift cancelling layer is formed on the second magnetic layer 303. The first and second magnetic layers 301 and 303 may be a reference layer and a storage layer, respectively.

A hard mask 304 having conductivity is formed on the second magnetic layer 303. The hard mask 304 is also used as the upper electrode of an MTJ element. The diameter of the hard mask 304 is smaller than the diameter of the lower electrode 205, and when viewed from above the hard disk 304 the hard mask 304 is placed in the lower electrode 205. The material of the hard mask 304 is, for example, TiN, Ti, Ta or W.

[FIGS. 12A and 12B]

The MTJ element 401 is formed by sequentially processing the second magnetic layer 303, the tunnel barrier layer 302 and the first magnetic layer 301 using the hard mask 304 as a mask. The MTJ element 401 is placed in the flat upper surface of the lower electrode 205. Therefore, the MTJ element 401 includes the high-quality layers 301-303. The MTJ element 401 includes the layers 301-303 and corresponds to the MTJ element M shown in FIGS. 1-3.

A conductor containing metal residue (for example, the material of the first magnetic layer 301) generated during the IBE process is likely to remain on the nitrogen-based insulating film 204 but is not likely to remain on the oxygen-based insulating film 201. As a result, the conductive layer 305 including the conductor formed on the oxygen-based insulating film 201 is thinner than the conductive layer 305 formed on the nitrogen-based insulating film 204 (FIG. 12A). In addition, the conductive layer 305 formed on the oxygen-based insulating film 201 is oxidized by oxygen generated from the oxygen-based insulating film 201. That is, a part or the whole of the conductive layer 305 on the oxygen-based insulating film 201 changes to an insulating layer. Therefore, a leak current between the neighboring elements 401, which is caused by the MTJ elements being connected via the conductive layer 305, is reduced.

In FIG. 12A, while the conductive layer 305 is formed on the whole surface of the oxygen-based insulating film 201, there is a case where the conductive layer 305 is formed on a part of the surface of the oxygen-based insulating film 201 so that the conductive layer 305 on the oxygen-based insulating film 201 is separated from the conductive layer 305 on the nitrogen-based insulating film 204. In this case, the leak current between the neighboring elements 401, which is caused by the MTJ elements being connected via the conductive layer 305, is not generated.

Alternatively, there is a case where the conductive layer 305 is not formed on the oxygen-based insulating film 201 (FIG. 12B). Also, in this case, the leak current between the neighboring MTJ elements 401, which is caused by the MTJ elements being connected via the conductive layer 305, is not generated.

In addition, oxygen is generated from the oxygen-based insulating film 201 during the IBE process. Since the magnetic layers 301 and 303 of the MTJ element 401 include metal such as iron, the MTJ element 401 is subject to the influence of oxygen. However, in the present embodiment, the oxygen-based insulating film 201 is placed outside the nitrogen-based insulating film 204 which does not contain oxygen of $Si_3N_4$, etc., and the oxygen-based insulating film 201 is placed farther away from the MTJ element 401 than the nitrogen-based insulating film 204. Therefore, the influence of oxygen generated from the oxygen-based insulating film 201 is reduced.

[FIG. 13]

An interlayer insulating film 306 is formed on the whole surface on the side of the MTI element 401, thereafter the surface of the interlayer insulating film 306 is planarized by CMP process. In the present embodiment, the interlayer insulating film 306 is, for example, a silicon oxide film. The interlayer insulating film 306 is formed by, for example, a CVD process.

By using a damascene process, a through hole reaching the hard mask 304 is formed in the interlayer insulating film 306, then a contact plug 307 is formed in the through-hole. The contact plug 307 corresponds to the plug TC shown in FIGS. 1-3.

Similarly, by using a damascene process, a contact hole 501 reaching the other source/drain region 104 (S1) of the first select transistor shown in FIG. 2 is formed in the interlayer insulating film 306 and the oxygen-based insulating film 201, then a contact plug 308 is formed in the contact hole 501. The contact plug 308 corresponds to the plug SC shown in FIGS. 1-3.

In the present embodiment, the contact hole 501 is formed by etching the interlayer insulating film 306 and the oxygen-based insulating film 201 using a photoresist pattern (not shown) as a mask, under a condition where an etching rate of the oxygen-based insulating film 201 is higher than an etching rate of the nitrogen-based insulating film 204.

Here, the contact hole 501 is formed while being shifted from a predetermined position due to a misalignment of the photoresist pattern, as a result, the contact plug 308 maybe formed in contact with the nitrogen-based insulating film 204, for example, as shown in FIGS. 14 and 15. FIG. 14 is a plan view schematically illustrating the oxygen-based insulating film 201, the nitrogen-based insulating film 204, the lower electrode 205 and the contact plug 308. FIG. 15 is a 15-15 cross-sectional view of FIG. 14.

In the present embodiment, as described above, the interlayer insulating film 305 and the oxygen-based insulating film 201 are etched under the condition where the etching rate of the oxygen-based insulating film 201 is higher than the etching rate of the nitrogen-based insulating film 204. Therefore, even the nitrogen-based insulating film 204 is subjected to the etching for forming the contact hole 501 due to the misalignment, the etching of the nitrogen-based insulating film 204 enough to expose the nitrogen-based insulating film 204 is suppressed. Thereby, short-circuiting of the contact plug 308 and the lower electrode 205 is prevented.

Alternatively, there is a case where the conductive layer 305 is exposed in the contact hole 501 due to the misalignment. Here, in the etching for forming the contact hole 501, gas containing oxygen is usually used, and the gas oxidizes the conductive layer 305 exposed in the contact hole 501. As a result, the contact plug 308 is connected to the lower electrode 205 via the oxidized conductive layer 305 (insulating layer), the short-circuiting (generation of leak current) of the contact plug 308 and the lower electrode 205 via the conductive layer 305 is suppressed.

Figure 13:
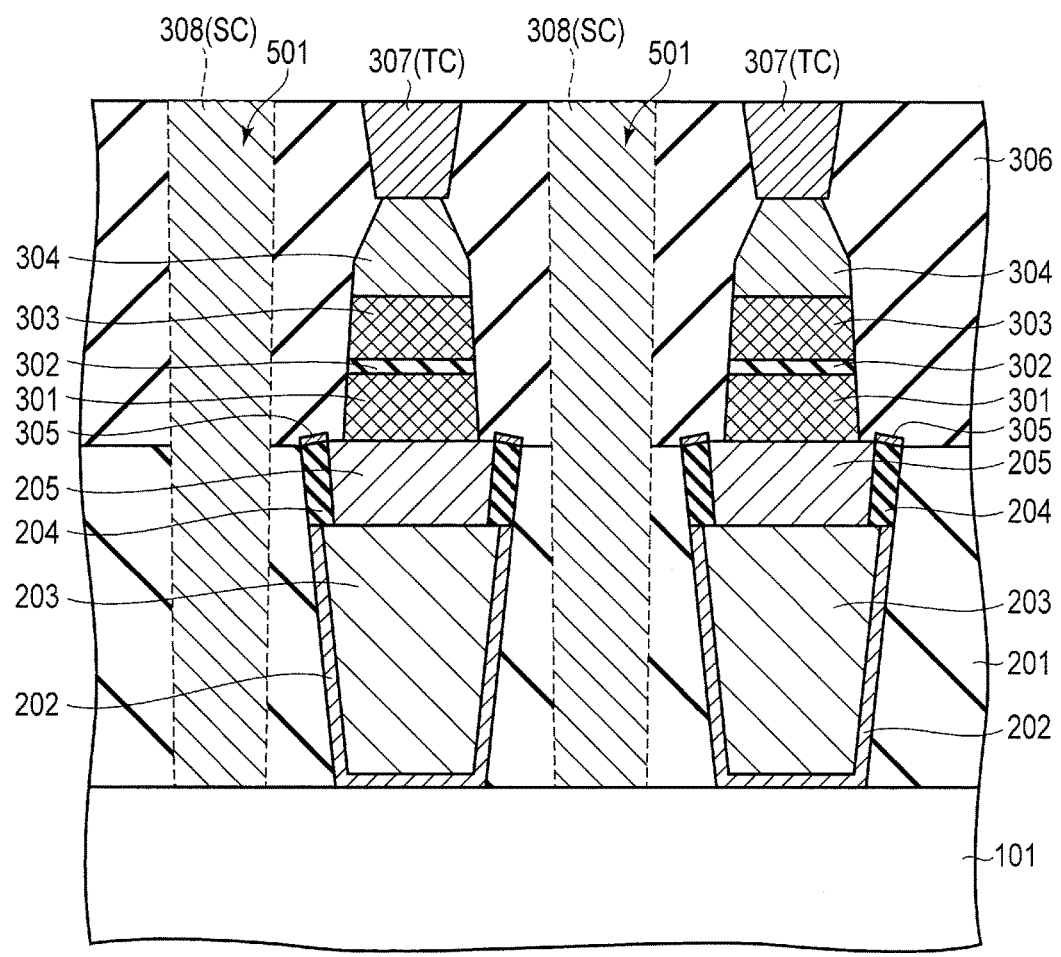
FIG. 13 is a cross-sectional view illustrating the method for manufacturing the magnetic memory, following FIGS. 12A and 12B.

After FIG. 13, the bit lines BL2 and BL1 are formed on the contact plugs 307 and 308, respectively, by a known process, thereby to obtain the magnetic memory shown in FIG. 4.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
 a substrate;
 an electrode provided on the substrate;
 a first insulating film surrounding a side surface of the electrode, the first insulating film containing oxygen;
 a second insulating film provided between the electrode and the first insulating film, the second insulating film surrounding the side surface of the electrode, and the second insulating film containing nitrogen;
 a magnetoresistance effect element provided on an upper surface of the electrode, a lower surface of the magnetoresistance effect element being smaller than the upper surface of the electrode;
 a third insulating film provided on the magnetoresistance effect element, the third insulating film containing oxygen; and
 a first plug penetrating the third insulating film and the first insulating film to reach the substrate,
 wherein a portion of the first insulating film and a portion of the third insulating film contact each other around the first plug.

2. The magnetic memory according to claim 1, wherein an oxygen concentration in the second insulating film is lower than an oxygen concentration in the first insulating film.

3. The magnetic memory according to claim 1, wherein a nitrogen concentration in the second insulating film is higher than a nitrogen concentration in the first insulating film.

4. The magnetic memory according to claim 1, further comprising a conductor provided on the second insulating film.

5. The magnetic memory according to claim 4, wherein the conductor contains a metal which is included in the magnetoresistance effect element.

6. The magnetic memory according to claim 4, wherein the conductor is further provided on the first insulating film, and a portion of the conductor provided on the first insulating film is thinner than a portion of the conductor provided on the second insulating film.

7. A magnetic memory comprising:
 a substrate;
 an electrode provided on the substrate;
 a first insulating film surrounding a side surface of the electrode, the first insulating film containing oxygen;
 a second insulating film provided between the electrode and the first insulating film, the second insulating film surrounding the side surface of the electrode, and the second insulating film containing nitrogen;
 a conductor provided on the second insulating film; and
 a magnetoresistance effect element provided on an upper surfaced of the electrode, a lower surface of the magnetoresistance effect element being smaller than the upper surface of the electrode,
 wherein the conductor is further provided on the first insulating film, and a portion of the conductor provided on the first insulating film is separated from a portion of the conductor provided on the second insulating film.

8. The magnetic memory according to claim 7, further comprising a plug which penetrates the first insulating film to reach the substrate.

9. The magnetic memory according to claim 8, wherein the plug contacts the second insulating film.

10. The magnetic memory according to claim 1, further comprising a second plug which is provided beneath the electrode and which connects the substrate and the electrode.

11. The magnetic memory according to claim 1, wherein the magnetoresistance effect element includes a first magnetic layer, a tunnel barrier layer provided on the first magnetic layer, and a second magnetic layer provided on the tunnel barrier layer.

12. The magnetic memory according to claim 1, wherein the portion of the first insulating film and the portion of the third insulating film directly contact around the first plug.

13. The magnetic memory according to claim 1, wherein the first plug does not penetrate through the second insulating film.

* * * * *